United States Patent
Wu et al.

(10) Patent No.: US 7,667,143 B2
(45) Date of Patent: Feb. 23, 2010

(54) CIRCUIT BOARD MODULE AND FORMING METHOD THEREOF

(75) Inventors: Chia-Jung Wu, Dalin Township, Chiayi County (TW); Che-Chih Chang, Toufen Township, Miaoli County (TW)

(73) Assignee: Au Optronics Corp., Hsin-Chu (TW)

( * ) Notice: Subject to any disclaimer, the term of this patent is extended or adjusted under 35 U.S.C. 154(b) by 602 days.

(21) Appl. No.: 11/474,432

(22) Filed: Jun. 26, 2006

(65) Prior Publication Data

US 2007/0128893 A1 Jun. 7, 2007

(30) Foreign Application Priority Data

Dec. 1, 2005 (TW) .............................. 94142375 A

(51) Int. Cl.
- *H01R 12/04* (2006.01)
- *H05K 1/11* (2006.01)
- *H05K 3/36* (2006.01)

(52) U.S. Cl. ........................................ 174/261; 29/830
(58) Field of Classification Search ................. 174/254, 174/261; 361/792–795; 29/830
See application file for complete search history.

(56) References Cited

U.S. PATENT DOCUMENTS 5,321,585 A * 6/1994 Trittschuh et al. ........... 361/784
6,538,207 B1 * 3/2003 Barth ......................... 174/254
6,833,526 B2 12/2004 Sinkunas et al.

FOREIGN PATENT DOCUMENTS

| JP | 2004-247569 | 9/2004 |
|----|-------------|--------|
| TW | 499826 | 8/2002 |
| TW | 544072 | 7/2003 |
| TW | 551784 | 9/2003 |

* cited by examiner

*Primary Examiner*—Jeremy C Norris
(74) *Attorney, Agent, or Firm*—Rabin & Berdo, PC

(57) ABSTRACT

A circuit board module and a forming method thereof are provided. The circuit board module includes a first circuit board, a second circuit board and a conductive structure. The first circuit board has a first surface, a second surface and an opening. The opening passes through the first surface and the second surface. The first surface has a first solder pad. The second circuit board has a second solder pad. Part of the second circuit board passes through the opening from the first surface to the second surface, so that part of the second solder pad is exposed on the first surface. The conductive structure is electrically connected to the first solder pad and the second solder pad, so that the first circuit board is electrically connected to the second circuit board.

19 Claims, 6 Drawing Sheets

CIRCUIT BOARD MODULE AND FORMING METHOD THEREOF

This application claims the benefit of Taiwan Patent Application Serial No. 94142375, filed Dec. 1, 2005, the subject matter of which is incorporated herein by reference.

BACKGROUND OF THE INVENTION

1. Field of the Invention

The invention relates in general to a circuit board module and a forming method thereof, and more particularly to a circuit board module capable of increasing the mechanical strength between two electrically connected flexible printed circuit boards and reducing the manufacturing cost and a forming method thereof.

2. Description of the Related Art

The flexible circuit board at least includes an insulated base, an adhering layer and a copper circuit. The flexible circuit board possesses the characteristics of flexibility, light-weight and thinness can be distributed three-dimensionally and embedded into a processed conductor freely. Due to the flexibility of the flexible circuit board, the circuit designer can use the flexible circuit board for three-dimensional distribution to fit the space design and the bending shapes of various electronic products.

The flexible circuit board is basically categorized as the single-layered flexible circuit board and the double-layered flexible circuit board. The single-layered flexible circuit board refers to the flexible circuit board with a single-layered circuit, and has only one layer of copper circuit. The double-layered flexible circuit board refers to the flexible circuit board with a double-layered circuit. The double-layered circuit has two layers of copper circuit. In the single-layered flexible circuit board, the copper circuit is disposed on the insulated base via an adhering layer, and the passivation layer covers part of the copper circuit and exposes the bare copper as a solder pad. In the double-layered flexible circuit board, the first copper circuit and the second copper circuit are respectively disposed on the top surface and the bottom surface of the base via respective adhering layer, and are electrically connected to each other via a conductive buried hole penetrating the base and the adhering layer. The first copper circuit and the second copper circuit are respectively covered by a passivation layer cover with a bare copper being exposed as a solder pad. Therefore, the flexible circuit board can be soldered to the solder pad of other circuit boards or other electronic elements via the bare copper.

Take the liquid crystal display (LCD) device for example. The control circuit board of the light emitting diode (LED) of a backlight module is a double-layered flexible circuit board. One of the solder pads has an LED, and the other solder pad can be soldered to the solder pad of the control circuit board of the liquid crystal display (LCD) panel. Therefore, the LED and the solder pad connected externally are positioned on different sides of the flexible circuit board. Besides, examples of the control circuit board of the LCD panel include a double-layered flexible circuit board.

Conventionally, if two flexible circuit boards are soldered according to the pressure soldering method to form a circuit board module, a double-layered flexible circuit board is most likely to be used. That is, the solder pads of the two double-layered flexible circuit boards are soldered together face to face via a solder, so that the two double-layered flexible circuit boards are electrically connected. However, the double-layered flexible circuit board is costive, so the manufacturing cost can not be reduced.

If the two flexible circuit boards are soldered together according to the draw soldering method, one of the two flexible circuit boards can be a single-layered flexible circuit board, which uses the bare copper as a solder pad to be soldered to the solder pad of the other flexible circuit board. Prior to the step of draw soldering, the single-layered flexible circuit board is disposed on the other flexible circuit board, so that the solder pad of the single-layered flexible circuit board and the solder pad of the other flexible circuit board face the same direction. One lateral side of the single-layered flexible circuit board has a solder pad, and the lateral side of the single-layered flexible circuit board covers part of the solder pad of the other flexible circuit board. Then, the draw soldering method is applied to solder the solder pad of the single-layered flexible circuit board to the solder pad of the other flexible circuit board, so that the single-layered flexible circuit board is electrically connected to the other flexible circuit board.

However, when defective soldering occurs in a conventional draw soldering method, empty soldering would occur beside a lateral side of the single-layered flexible circuit board, causing the mechanical strength connecting the single-layered flexible circuit board and the other flexible circuit board to be weakened significantly. Under the interference of an external force, the bare copper would crack easily and the copper circuit would be disconnected easily. In a worse case, peeling would occur between the single-layered flexible circuit board and the other flexible circuit board, largely reducing the reliability and practicality of the circuit board module and increasing the manufacturing cost. In order to avoid empty soldering, more time needs to be spent on draw soldering. As disclosed above, the single-layered flexible circuit board adopting the draw soldering method has several disadvantages. In actual application, the double-layered flexible circuit board is more commonly used. However, using the double-layered flexible circuit board would increase the manufacturing cost. Regardless whether the single-layered flexible circuit board or the double-layered flexible circuit board is used, the pressure soldering method and the draw soldering method have their own problems to be tackled in forming a circuit board module.

SUMMARY OF THE INVENTION

It is therefore an object of the invention to provide a circuit board module and a forming method thereof. One single-layered flexible circuit board passes through the other flexible circuit board first and then the single-layered flexible circuit board is soldered to the solder pad of the other flexible circuit board facing the same direction, not only reducing the manufacturing cost but also avoiding empty soldering. Besides, the invention covers the flexible portion of the other flexible circuit board by a single-layered flexible circuit board first and then solders the single-layered flexible circuit board to the solder pad of the flexible portion facing the same direction, hence enhancing the mechanical strength between the single-layered flexible circuit board and the other flexible circuit board during soldering.

The invention achieves the above-identified object by providing a circuit board module including a first circuit board, a first solder pad, a second circuit board and a conductive structure. The first circuit board has an opening, a first surface, a second surface opposite to the first surface. The opening passes through the first surface and the second surface. The first solder pad is formed on the first surface. The second circuit board has a second solder pad. Part of the second circuit board passes through the opening and exposes the second solder pad on the first surface of the first circuit board. The conductive structure is electrically connected to the first solder pad and the second solder pad.

The invention further achieves the above-identified object by providing a circuit board module including a first circuit board, a first solder pad, a second circuit board, a second solder pad and a conductive structure. The first circuit board has an opening and a flexible portion. The opening surrounds part of the flexible portion. The first solder pad is formed on the flexible portion. The second circuit board has a first surface and a second surface. Part of the second surface is disposed on part of the flexible portion. The second solder pad is formed on the first surface. The conductive structure is electrically connected to the first solder pad and the second solder pad.

The invention further achieves the above-identified object by providing a method of forming a circuit board module. Firstly, a first circuit board and a second circuit board are provided. The first circuit board has a first surface, a second surface and an opening. The opening passes through the first surface and the second surface. The first surface has a first solder pad. The second circuit board has a second solder pad. Then, part of the second circuit board passes through the opening from the first surface to the second surface, so that part of the second solder pad is exposed on the first surface. Then, the first solder pad is electrically connected to the second solder pad, so that the first circuit board is electrically connected to the second circuit board.

The invention further achieves the above-identified object by providing yet another method of forming a circuit board module. Firstly, a first circuit board and a second circuit board are provided. The first circuit board has an opening and a flexible portion. The opening surrounds part of the flexible portion and passes through the first circuit board. The flexible portion has a first solder pad. The second circuit board has a first surface and a second surface. The first surface has a second solder pad. Then, part of the second surface is disposed on part of the flexible portion. Then, the first solder pad is electrically connected to the second solder pad, so that the first circuit board is electrically connected to the second circuit board.

Other objects, features, and advantages of the invention will become apparent from the following detailed description of the preferred but non-limiting embodiments. The following description is made with reference to the accompanying drawings.

DETAILED DESCRIPTION OF THE INVENTION

First Embodiment

Figure 1A:
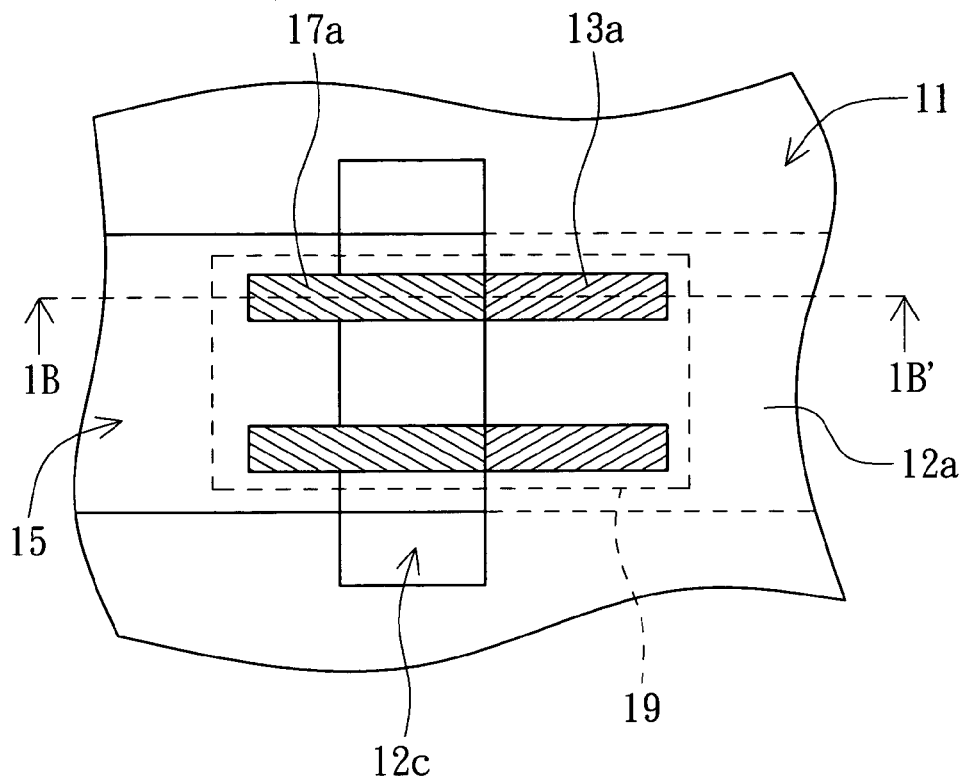
FIG. 1A is a top view of a circuit board module according to a first embodiment of the invention.
Figure 1B:
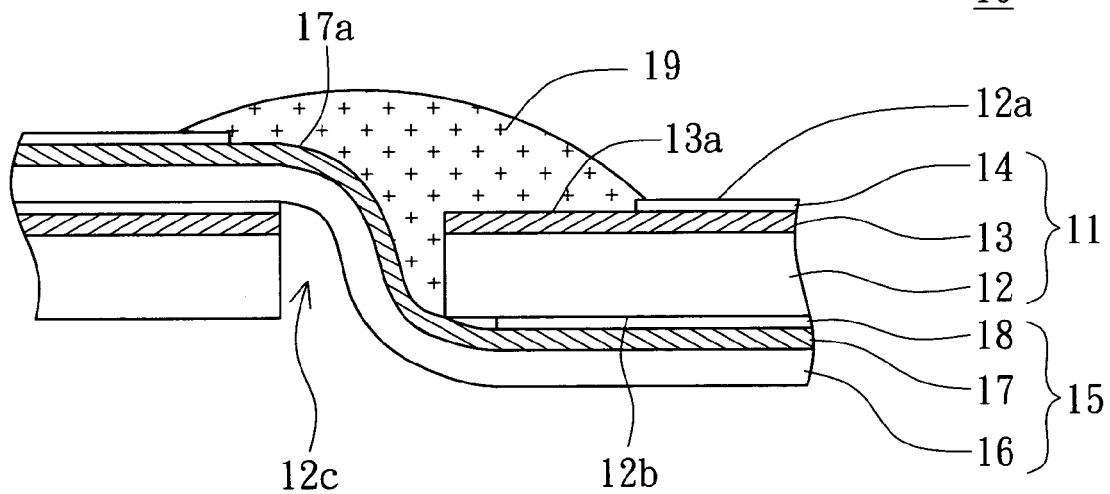
FIG. 1B is a cross-sectional view of the circuit board module viewed along the cross-sectional line 1B-1B' of FIG. 1A.
Figure 1C:
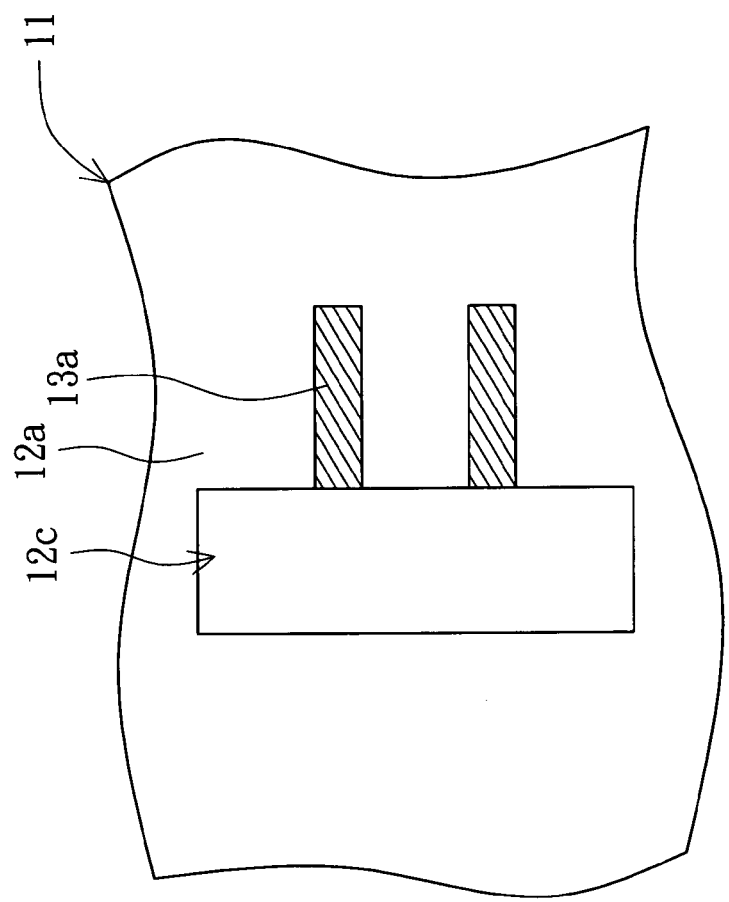
FIG. 1C is an exploded diagram of a first circuit board and a second circuit board of FIG. 1A.
Figure 1C:
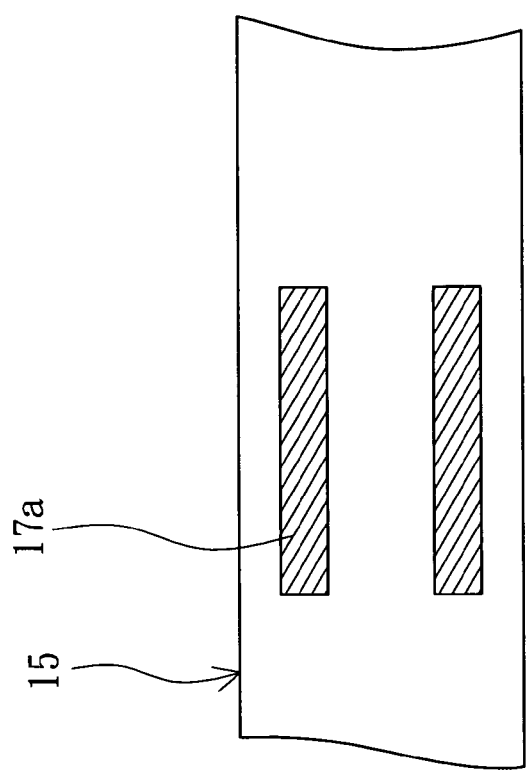

Referring to FIGS. 1A~1C. FIG. 1A is a top view of a circuit board module according to a first embodiment of the invention. FIG. 1B is a cross-sectional view of the circuit board module viewed along the cross-sectional line 1B-1B' of FIG. 1A. FIG. 1C is an exploded diagram of a first circuit board and a second circuit board of FIG. 1A. As shown in FIGS. 1A~1C, the circuit board module 10 includes a first circuit board 11, a second circuit board 15 and a conductive structure 19. Examples of the first circuit board 11 and the second circuit board 15 include a flexible circuit board. The first circuit board 11 has a first surface 12a, a second surface 12b and an opening 12c. The first surface 12a is opposite to the second surface 12b. The opening 12c passes through the first surface 12a and the second surface 12b. The first surface 12a has a first solder pad 13a. The second circuit board 15 has a second solder pad 17a. Part of the second circuit board 15 passes through the opening 12c from the first surface 12a to the second surface 12b, so that part of the second solder pad 17a is exposed on the first surface 12a. The conductive structure 19 is electrically connected to the first solder pad 13a and the second solder pad 17a, so that the first circuit board 11 is electrically connected to the second circuit board 15.

Before the second circuit board 15 passes through the first circuit board 11, despite the first solder pad 13a and the second solder pad 17a face the same direction, the second solder pad 17a being afar from the first solder pad 13a is not easy to draw solder the first solder pad 13a. After the second circuit board 15 passes through the first circuit board 11, the first solder pad 13a and the second solder pad 17a still face the same direction, but the distance between the first solder pad 13a and the second solder pad 17a is shortened. Therefore, the draw soldering between the first solder pad 13a and the second solder pad 17a becomes easier.

The conductive structure 19 is a solder, which solders the first solder pad 13a to the second solder pad 17a according to the draw soldering method on the first surface 12a, and covers the first solder pad 13a and the second solder pad 17a. Apart from using the draw soldering method to form the conductive structure 19 and electrically connect the first solder pad 13a to the second solder pad 17a, any structures capable of electrically connecting the first solder pad 13a and the second solder pad 17a are applicable to the invention. Besides, examples of the first circuit board 11 include a first control circuit board of a liquid crystal display (LCD) panel, and examples of the second circuit board 15 include a second control circuit board of a light source of a backlight module such as the second control circuit board of a light emitting diode (LED). In the other way round, the second circuit board 15 can be a first control circuit board of an LCD panel, and the first circuit board 11 can be a second control circuit board of a light source of a backlight module light source. The first circuit board 11 and the second circuit board 15 are a combination of the first control circuit board of the liquid crystal display panel and the second control circuit board of the light source of the backlight module. Besides, the first circuit board 11 and the second circuit board 15 can be one flexible circuit board with a double-layered circuit and one flexible circuit board with a single-layered circuit, respectively. That is, one is a single-layered flexible circuit board and the other is a double-layered flexible circuit board. Moreover, the first circuit board 11 and the second circuit board 15 can be two flexible circuit boards with a single-layered circuit, that is, two single-layered flexible circuit boards.

In the present embodiment of the invention, the first circuit board 11 and the second circuit board 15 are exemplified by two flexible circuit boards with a single-layered circuit. The first circuit board 11 includes a base 12, a metallic circuit layer 13 and a passivation layer 14. The base 12 has a second surface 12b, that is, the bottom surface of the base 12 is the second surface 12b disclosed above. The metallic circuit layer 13 is disposed on the base 12, and has a first solder pad 13a. The passivation layer 14 is disposed on the base 12, covers part of the metallic circuit layer 13, and exposes the first solder pad 13a. The passivation layer 14 has a first surface 12a, that is, the top surface of the passivation layer 14 is the first surface 12a disclosed above. The opening 12c further passes through the base 12, the metallic circuit layer 13 and the passivation layer 14. Besides, the second circuit board 15 includes a base 16, a metallic circuit layer 17 and a passivation layer 18. The metallic circuit layer 17 is disposed on the base 16, and has a second solder pad 17a. The passivation layer 18 is disposed on the base 16, covers part of the metallic circuit layer 17, and exposes the second solder pad 17a.

Any one who is skilled in the technology of will understand that the technology of the present embodiment of the invention is not limited thereto. For example, the size of the opening 12c must allow part of the second circuit board 15 to pass through, so that the second solder pad 17a is exposed on the first surface 12a. Furthermore, the first solder pad 13a and the second solder pad 17a almost face the same direction. That is, the size of the opening 12c is at least equal to or larger than the corresponding width or thickness of the second circuit board 15. Besides, examples of the bases 12 and 16 include a polyimide (PI) film. The metallic circuit layer 13 can be adhered on the base 12 via an adhering layer. Moreover, the metallic circuit layer 17 can be adhered on the base 16 via the other adhering layer.

According to the present embodiment of the invention, the single-layered flexible circuit board passes through the other flexible circuit board first, and then solders the single-layered flexible circuit board as well as the solder pad of the flexible circuit board facing the same direction, largely reducing the manufacturing cost, avoiding empty soldering, and increasing the reliability and practicality of the circuit board module. Thus, the mechanical strength connecting the single-layered flexible circuit board and the other flexible circuit board is enhanced, and peeling between the single-layered flexible circuit board and the other flexible circuit board under the interference of an external force is avoided. Since empty soldering is avoided, the present embodiment of the invention saves considerable soldering hours. Besides, the present embodiment of the invention employs a single-layered flexible circuit board, hence reducing the manufacturing cost. The draw soldering of the present embodiment of the invention being simple both in terms of design and manufacturing is easy to be used in actual production. Compared with the design of adopting the double-layered flexible circuit board, the present embodiment of the invention reduces the manufacturing cost and at the same time maintains the same function and mechanical strength without making the manufacturing process complicated.

Second Embodiment

Figure 2A:
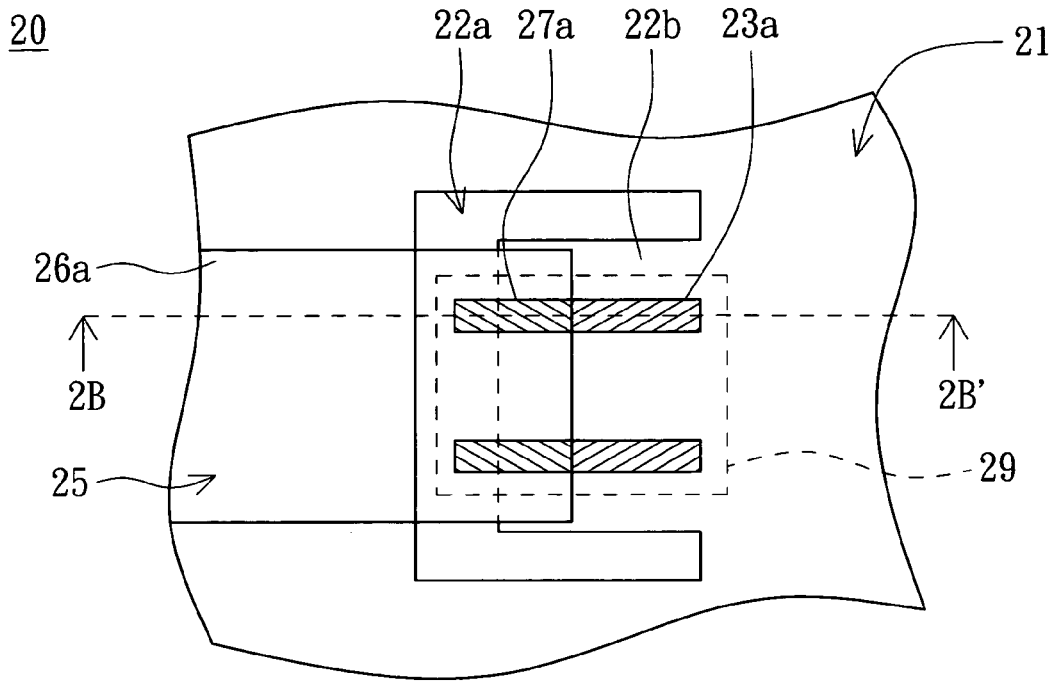
FIG. 2A is a top view of a circuit board module according to a second embodiment of the invention.
Figure 2B:
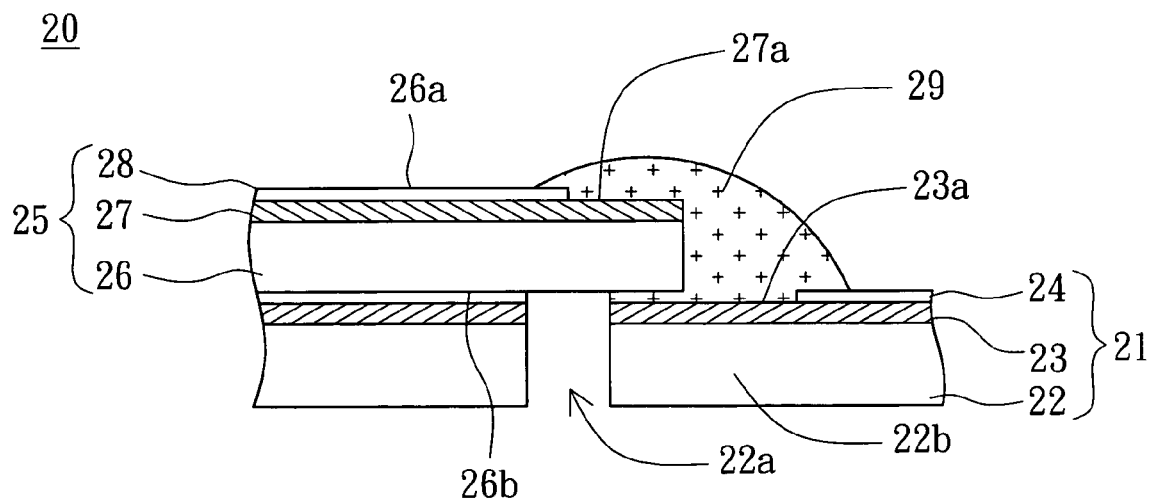
FIG. 2B is a cross-sectional view of the circuit board module viewed along the cross-sectional line 2B-2B' of FIG. 2A.
Figure 2C:
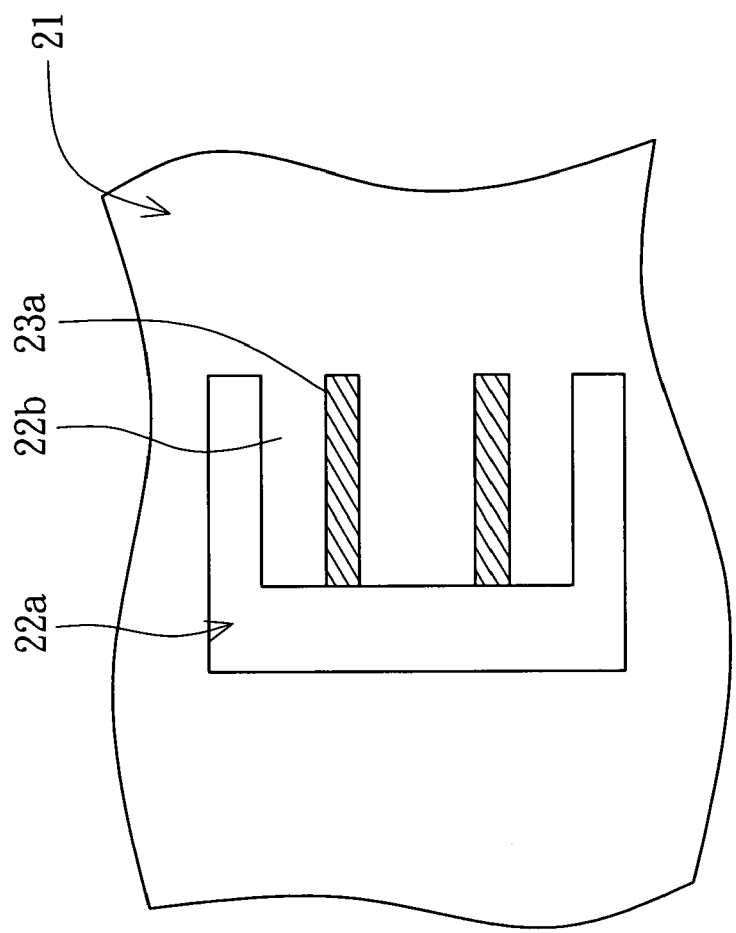
FIG. 2C is an exploded diagram of a first circuit board and a second circuit board of FIG. 2A.
Figure 2C:
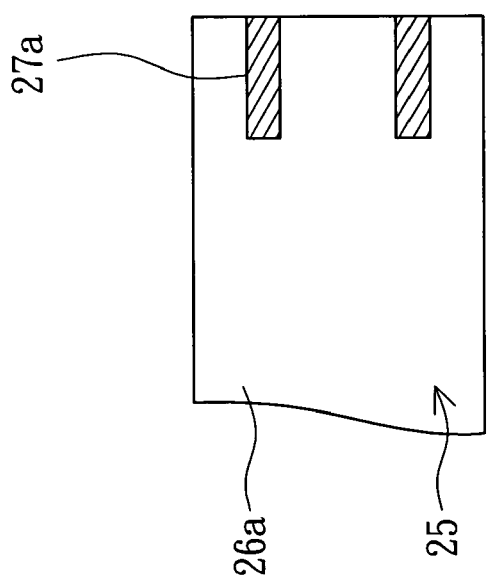

Referring to FIGS. 2A~2C. FIG. 2A is a top view of a circuit board module according to a second embodiment of the invention. FIG. 2B is a cross-sectional view of the circuit board module viewed along the cross-sectional line 2B-2B' of FIG. 2A. FIG. 2C is an exploded diagram of a first circuit board and a second circuit board of FIG. 2A. As shown in FIGS. 2A~2C, the circuit board module 20 includes a first circuit board 21, a second circuit board 25 and a conductive structure 29. Examples of the first circuit board 21 and the second circuit board 25 include a flexible circuit board. The first circuit board 21 has an opening 22a and a flexible portion 22b. The opening 22a surrounds part of the flexible portion 22b and passes through the first circuit board 21, so that the flexible portion 22b has buffer and bending functions. The flexible portion 22a has a first solder pad 23a. The second circuit board 25 has a first surface 26a and a second surface 26b. The first surface 26a is opposite to the second surface 26b. The first surface 26a has a second solder pad 27a. Part of the second surface 26b is disposed on part of the flexible portion 22b. The second surface 26b further covers part of the opening 22a and part of the first solder pad 23a. The conductive structure 29 is electrically connected to the first solder pad 23a and the second solder pad 27a, so that the first circuit board 21 is electrically connected to the second circuit board 25.

With the second circuit board 25 being disposed on part of the flexible portion 22b of the first circuit board 21 and under the interference of an external force, the flexible portion 22b served as a buffer against the external force is appropriately bent to divert the external force. Therefore, the mechanical strength between the second circuit board 25 and the first circuit board 21 during soldering is enhanced, and peeling between the second circuit board 25 and the first circuit board 21 is avoided.

The conductive structure 29 is a solder, which solders the first solder pad 23a and the second solder pad 27a according to the draw soldering method and covers the first solder pad 23a and the second solder pad 27a. Apart from using the draw soldering method to form the conductive structure 29 and electrically connect the first solder pad 23a to the second solder pad 27a, any structures capable of electrically connecting the first solder pad 23a and the second solder pad 27a are applicable to the invention. Besides, examples of the first circuit board 21 include a first control circuit board of a liquid crystal display panel (LCD panel), and examples of the second circuit board 25 include a second control circuit board of a light source of a backlight module such as the control circuit board of a light emitting diode (LED). In the other way round, the second circuit board 25 can be a first control circuit board of an LCD panel, and the first circuit board 21 can be a second control circuit board of a light source of a backlight module light source. The first circuit board 21 and the second circuit board 25 are a combination of the first control circuit board of an LCD panel and the second control circuit board of the light source of the backlight module. Besides, the first circuit board 21 and the second circuit board 25 can be a flexible circuit board with a double-layered circuit and a flexible circuit board with a single-layered circuit, respectively. That is, one is a single-layered flexible circuit board and the other is a double-layered flexible circuit board. Moreover, the first circuit board 21 and the second circuit board 25 can be two flexible circuit boards with a single-layered circuit, that is, two single-layered flexible circuit boards.

In the present embodiment of the invention, the first circuit board 21 and the second circuit board 25 are exemplified by two flexible circuit boards with a single-layered circuit. The first circuit board 21 includes a base 22, a metallic circuit layer 23 and a passivation layer 24. The base 12 an opening 22a and a flexible portion 22b. The metallic circuit layer 23 is disposed on the base 22, and has a first solder pad 23a. The passivation layer 24 is disposed on the base 22, covers part of the metallic circuit layer 23, and exposes the first solder pad 23a. The opening 22a further passes through the base 22, the metallic circuit layer 23 and the passivation layer 24. Besides, the second circuit board 25 includes a base 26, a metallic circuit layer 27 and a passivation layer 28. The base 26 has a second surface 26b, that is, the bottom surface of the base 26 is the second surface 26b disclosed above. The metallic circuit layer 27 is disposed on the base 26, and has a second solder pad 27a. The passivation layer 28 is disposed on the base 26, covers part of the metallic circuit layer 27, and exposes the second solder pad 27a. The passivation layer 28 has a first surface 26a, that is, the top surface of the passivation layer 28 is the first surface 26a disclosed above.

Any one who is skilled in the technology of the present embodiment of the invention will understand that the present embodiment of the invention is not limited thereto. For example, the design of the opening 22a surrounding the flexible portion 22b must allow the flexible portion 22b to have flexibility. The opening 22a can be a U-shaped opening, so that the draw soldering direction of the first solder pad 23a and the second solder pad 27a is substantially parallel to the direction of the flexible portion 22b extended to the opening 22a. As for the shape of the opening 22a, apart from the U shape, the opening can be an E-shaped opening or any other shaped openings as long as the flexible portion is enabled to have buffer and bending functions are applicable to the invention. Besides, examples of the bases 22 and 26 include a polyimide (PI) film. Besides, the metallic circuit layer 23 can be adhered on the base 22 via an adhering layer. Moreover, the metallic circuit layer 27 can be adhered on the base 26 via the other adhering layer. Since the first circuit board 21 and the second circuit board 22 are not horizontal, a gap exists between the first circuit board 21 and the second circuit board 22 above the first solder pad 27a. Before the first solder pad 23a is electrically to the second solder pad 27a, the first circuit board 21 is pressed downwardly, so that the first solder pad 23a contacts the second solder pad 27a to facilitate soldering.

It is noted that after the second circuit board 25 of the present embodiment of the invention can penetrate the opening 12c of the first circuit board 11 of the first embodiment, the second solder pad 27a is electrically connected to the first solder pad 13a via the other conductive structure to form the other circuit board module. Or, after the second circuit board 15 of the first embodiment passes through the opening 22a of the first circuit board 21 of the present embodiment of the invention, the second solder pad 17a is electrically connected to the first solder pad 23a via the other conductive structure to form the other circuit board module.

According to the present embodiment of the invention, the single-layered flexible circuit board covers the flexible portion of the other flexible circuit board first, and then solders the single-layered flexible circuit board as well as the solder pad of the flexible portion facing the same direction, largely enhancing the mechanical strength between the single-layered flexible circuit board and the other flexible-circuit board during soldering. Thus, the single-layered flexible circuit board and the other flexible circuit board are prevented from peeling apart when receiving an external force. Besides, the draw soldering of the present embodiment of the invention being simple in both the design and manufacturing is easy to be adopted in actual production. Compared with the design of adopting a double-layered flexible circuit board, the present embodiment of the invention reduces the manufacturing cost and at the same time maintains the same function and mechanical strength without making the manufacturing process complicated.

Third Embodiment

Figure 3:
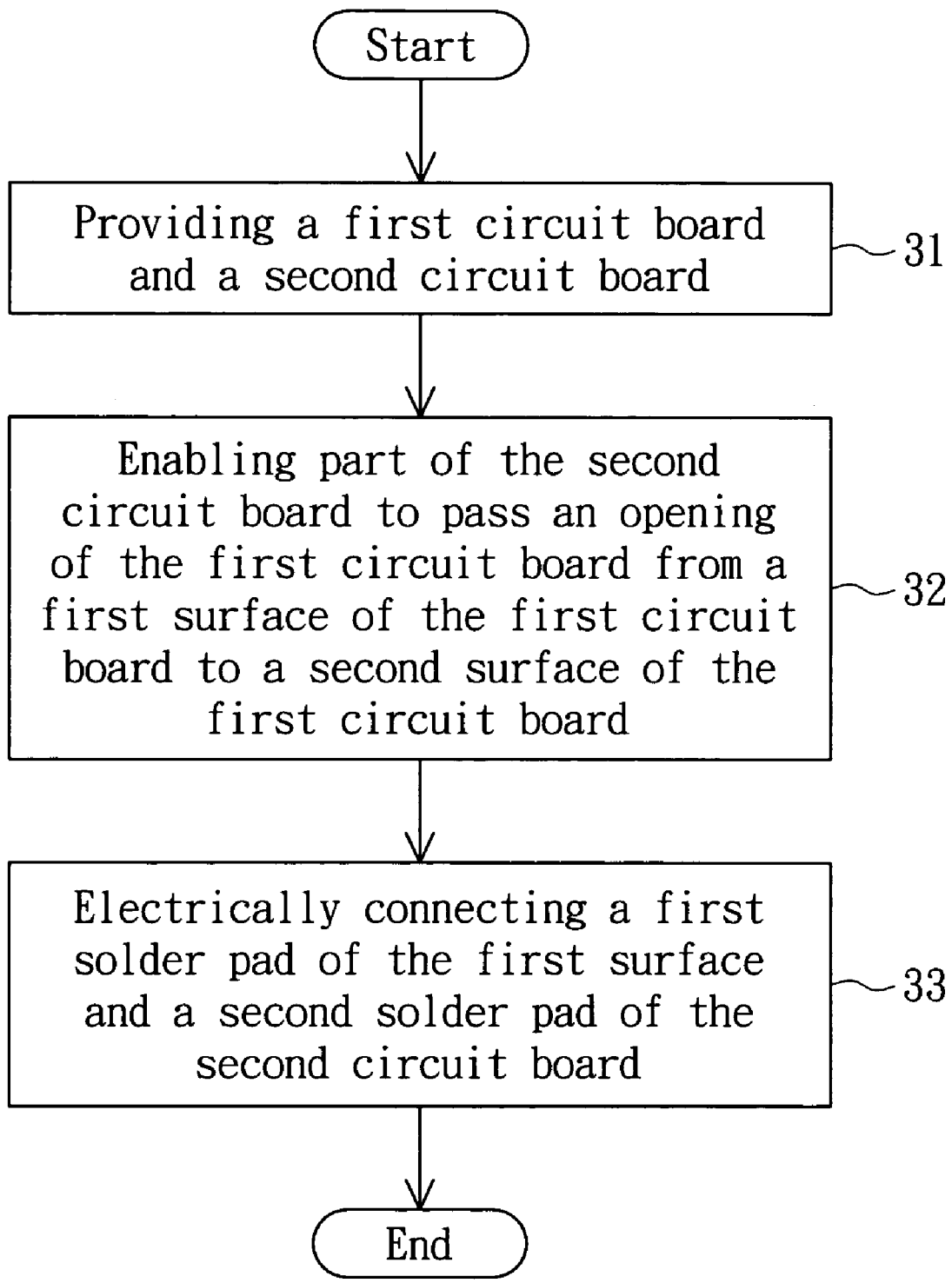
FIG. 3 is a flowchart of method of forming a circuit board module according to a third embodiment of the invention.

Referring to FIG. 3, a flowchart of method of forming a circuit board module according to a third embodiment of the invention is shown. Referring to FIGS. 1A~1C. Firstly, in step 31, a first circuit board 11 and a second circuit board 15 are provided. The first circuit board 11 has a first surface 12a, a second surface 12b and an opening 12c. The first surface 12a is opposite to the second surface 12b. The opening 12c passes through the first surface 12a and the second surface 12b. The first surface 12a has a first solder pad 13a. The second circuit board 15 has a second solder pad 17a. The size of the opening 12c must allow part of the second circuit board 15 to pass through. In the embodiment, the first circuit board 11 and the second circuit board 15 are two flexible circuit boards.

Next, proceed to step 32, with the first solder pad 13a and the second solder pad 17a facing the same direction, part of the second circuit board 15 passes through the opening 12c from the first surface 12a to the second surface 12b, so that part of the second solder pad 17a is exposed on the first surface 12a, and that the distance between the first solder pad 13a and the second solder pad 17a is shortened. Before the second circuit board 15 passes through the first circuit board 11, the first solder pad 13a and the second solder pad 17a are arranged to face the same direction, but the second solder pad 17a is still afar from the first solder pad 13a.

Then, proceed to step 33, the first solder pad 13a is electrically connected to the second solder pad 17a, so that the first circuit board 11 and the second circuit board 15 are conducted. The step of electrically connecting the first solder pad 13a to the second solder pad 17a is achieved by using a conductive structure 19 to electrically connect the first solder pad 13a and the second solder pad 17a.

An actual application is disclosed below with the first circuit board 11 and the second circuit board 15 respectively exemplified by a first control circuit board of an LCD panel and a second control circuit board of an LED.

Firstly, an opening is disposed on the first control circuit board of the LCD panel for receiving the second control circuit board of the LED. Then, prior to soldering, the second control circuit board of the LED is inserted into the opening of the first control circuit board of the LCD panel. Then, the step of draw soldering is applied to the first solder pad 23a of the first control circuit board of the LCD panel as well as the second solder pad 27a of the second control circuit board of the LED, so that the first control circuit board of the LCD panel and the second control circuit board of the LED are mutually conducted and connected.

Fourth Embodiment

Figure 4:
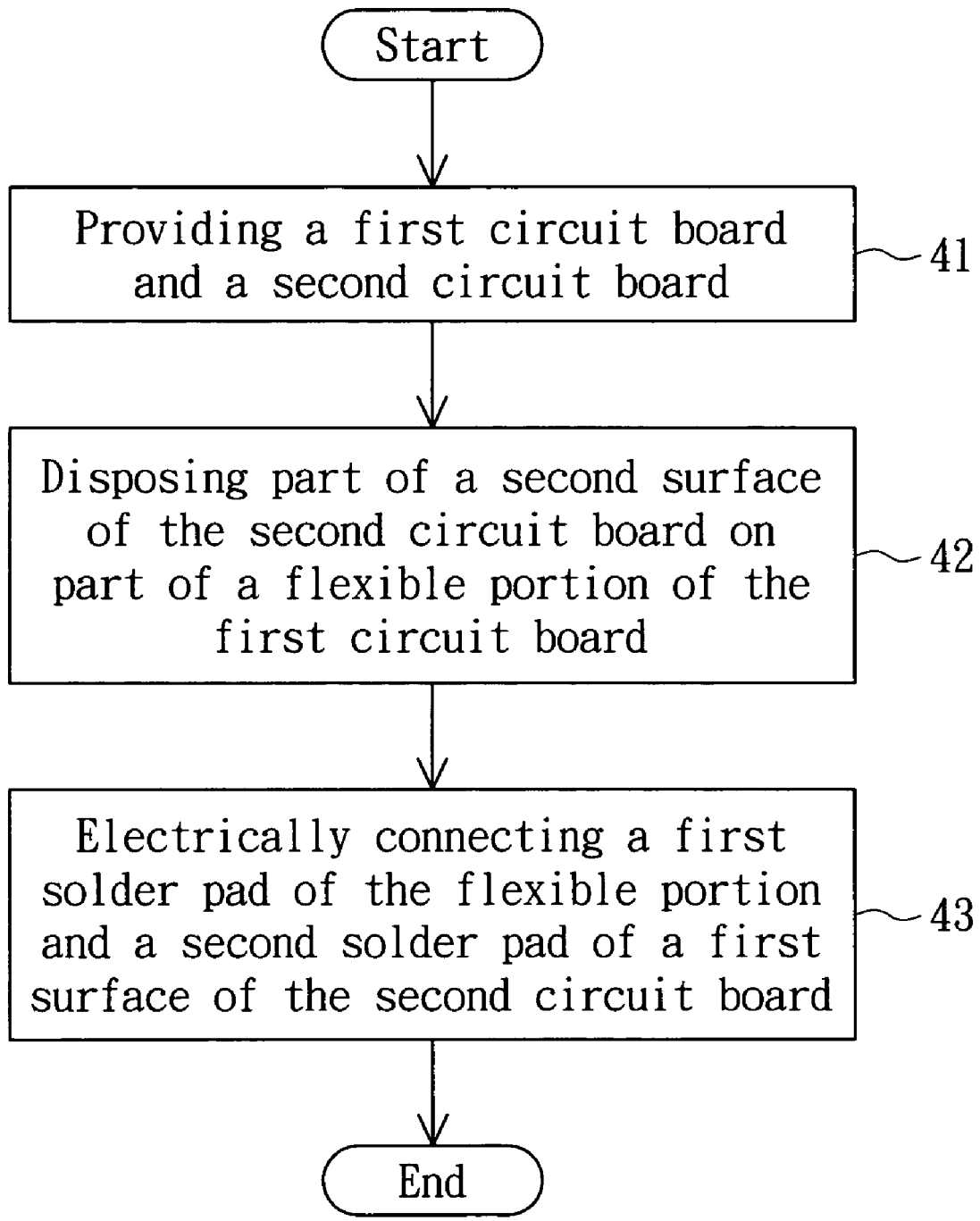
FIG. 4 is a flowchart of method of forming a circuit board module according to a fourth embodiment of the invention.

Referring to FIG. 4, a flowchart of method of forming a circuit board module according to a fourth embodiment of the invention is shown. Referring to FIGS. 2A~2C. First, in step 41, a first circuit board 21 and a second circuit board 25 are provided. The first circuit board 21 has an opening 22a and a flexible portion 22b. The opening 22a surrounds part of the flexible portion 22b and passes through the first circuit board 21. The flexible portion 22a has a first solder pad 23a. The second circuit board 25 has a first surface 26a and a second surface 26b. The first surface 26a is opposite to the second surface 26b. The first surface 26a has a second solder pad 27a. The opening 22a passes through the first circuit board 21.

Next, proceed to step 42, with the first solder pad 23a and the second solder pad 27a facing the same direction, part of the second surface 26b is disposed on part of the flexible portion 22b. The second surface 26b further covers part of the opening 22a and part of the first solder pad 23a. Before disposing the second circuit board 25 on the first circuit board 21, the first solder pad 23a and the second solder pad 27a are arranged to face the same direction.

Then, proceed to step 43, the first solder pad 23a is electrically connected to the second solder pad 27a, so that the first circuit board 21 is electrically connected to the second circuit board 25. The step of electrically connecting the first solder pad 23a and the second solder pad 27a is achieved by using a conductive structure 29 to electrically connect the first solder pad 23a and the second solder pad 27a.

An actual application is disclosed below with the first circuit board 21 and the second flexible circuit board 25 respectively exemplified by a first control circuit board of an LCD panel and a second control circuit board of an LED.

Firstly, an opening and a flexible portion are disposed on the first control circuit board of the LCD panel, and the opening surrounds part of the flexible portion 22b. Then, prior to soldering, the second control circuit board of the LED is disposed on the first control circuit board of the LCD panel, so that the second control circuit board of the LED covers part of the opening 22a and contacts part of the flexible portion 22b, and that the first solder pad 23a and the second solder pad 27a face the same direction. Then, the step of draw soldering is applied to the first solder pad 23a of the second control circuit board of the LCD panel as well as the second solder pad 27a of the second control circuit board of the LED, so that the second control circuit board of the LCD panel and the second control circuit board of the LED are mutually conducted and connected.

According to the circuit board module and the forming method thereof disclosed in the above embodiments of the invention, one single-layered flexible circuit board passes through the other flexible circuit board first and then the single-layered flexible circuit board is soldered to the solder pad of the other flexible circuit board facing the same direction, not only reducing the manufacturing cost but also avoiding empty soldering. Besides, the present embodiment of the invention covers the flexible portion of the other flexible circuit board by a single-layered flexible circuit board first, and then solders the single-layered flexible circuit board to the solder pad of the flexible portion facing the same direction, hence enhancing the mechanical strength between the single-layered flexible circuit board and the other flexible circuit board during soldering. Besides, the present embodiment of the invention employs a single-layered flexible circuit board, hence reducing the manufacturing cost. The draw soldering of the present embodiment of the invention being simple in both the design and manufacturing is easy to be adopted in actual production. Compared with the design of adopting a double-layered flexible circuit board, the present embodiment of the invention reduces the manufacturing cost and at the same time maintains the same function and mechanical strength without making the manufacturing process complicated.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A circuit board module, comprising:
   a first circuit board having an opening, a first surface, and a second surface opposite to the first surface;
   a first solder pad formed on the first surface;
   a second circuit board having a second solder pad, wherein part of the second circuit board passes through the opening and exposes the second solder pad on the first surface of the first circuit board; and
   a conductive structure electrically connected to the first solder pad and the second solder pad;
   wherein the first solder pad and the second solder pad face the same direction.

2. The circuit board module according to claim 1, wherein the first circuit board comprises:
   a base;
   a metallic circuit layer disposed on the base, wherein the first solder pad is formed on the metallic circuit layer; and
   a passivation layer disposed on the base, covering part of the metallic circuit layer, and exposing the first solder pad, wherein the opening passes through the base, the metallic circuit layer, and the passivation layer.

3. The circuit board module according to claim 1, wherein the second circuit board comprises:
   a base;
   a metallic circuit layer disposed on the base, wherein the second solder pad is formed on the metallic circuit layer of the second circuit board; and
   a passivation layer disposed on the base, covering part of the metallic circuit layer, and exposing the second solder pad.

4. The circuit board module according to claim 1, wherein the second circuit board is a flexible circuit board with a single-layered circuit.

5. The circuit board module according to claim 1, wherein the first solder pad is substantially parallel to the second solder pad disposed on the first surface.

6. A circuit board module, comprising:
   a first circuit board having an opening and a flexible portion, wherein the opening surrounds part of the flexible portion;
   a first solder pad formed on the flexible portion;
   a second circuit board having a first surface and a second surface, part of the second surface being disposed on part of the flexible portion;
   a second solder pad formed on the first surface; and
   a conductive structure electrically connected to the first solder pad and the second solder pad.

7. The circuit board module according to claim 6, wherein the first circuit board comprises:
   a base;
   a metallic circuit layer disposed on the base, wherein the first solder pad is formed on the metallic circuit layer; and
   a passivation layer disposed on the base, covering part of the metallic circuit layer, and exposing the first solder pad, wherein the opening passes through the base, the metallic circuit layer and the passivation layer.

8. The circuit board module according to claim 6, wherein the second circuit board comprises:
   a base;
   a metallic circuit layer disposed on the base, wherein the second solder pad is formed on the metallic circuit layer; and a passivation layer disposed on the base, covering part of the metallic circuit layer, and exposing the second solder pad.

9. The circuit board module according to claim 6, wherein the second circuit board is a flexible circuit board with a single-layered circuit.

10. The circuit board module according to claim 6, wherein the second surface covers part of the opening.

11. The circuit board module according to claim 6, wherein the opening is a U-shaped opening.

12. The circuit board module according to claim 6, wherein the second surface covers part of the first solder pad.

13. The circuit board module according to claim 6, wherein the first solder pad and the second solder pad face the same direction.

14. The circuit board module according to claim 6, wherein the first solder pad is substantially parallel to the second solder pad disposed on the first surface.

15. A method of forming a circuit board module, comprising:
   providing a circuit board module comprising a first circuit board having an opening, a first surface, and a second surface opposite to the first surface, a first solder pad formed on the first surface, and a second circuit board having a second solder pad formed thereon;
   arranging the first solder pad and the second solder pad so that the first and second solder pads face the same direction;
   arranging part of the second circuit board to pass the opening so that part of the second solder pad is exposed on the first surface; and
   electrically connecting the first solder pad and the second solder pad.

16. A method of forming a circuit board module, comprising:
   providing a circuit board module comprising a first circuit board having an opening and a flexible portion partially surrounded by the opening, a first solder pad formed on the flexible portion, a second circuit board having a first surface and a second surface opposite to the first surface, and a second solder pad formed on the first surface;
   disposing part of the second surface on part of the flexible portion; and
   electrically connecting the first solder pad and the second solder pad.

17. The method according to claim 16, wherein the step of disposing part of the second surface on part of the flexible portion further comprises:
   disposing part of the second surface on part of the flexible portion by covering part of the opening.

18. The method according to claim 16, wherein the step of disposing part of the second surface on part of the flexible portion further comprises:
   disposing part of the second surface on part of the flexible portion by covering part of the first solder pad.

19. The method according to claim 16, wherein after the step of providing the circuit board module, further comprising:
   arranging the first solder pad and the second solder pad so that the first and second solder pads face the same direction.

* * * * *

UNITED STATES PATENT AND TRADEMARK OFFICE
CERTIFICATE OF CORRECTION

| | | |
|---|---|---|
| PATENT NO. | : 7,667,143 B2 | Page 1 of 1 |
| APPLICATION NO. | : 11/474432 | |
| DATED | : February 23, 2010 | |
| INVENTOR(S) | : Wu et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 831 days.

Signed and Sealed this

Seventh Day of December, 2010

David J. Kappos
*Director of the United States Patent and Trademark Office*